United States Patent [19]
Avery

[11] 3,783,394
[45] Jan. 1, 1974

[54] FREQUENCY COMPARATOR SYSTEM

[75] Inventor: Leslie Ronald Avery, Byfleet, England

[73] Assignee: RCA Corporation, New York, N.Y.

[22] Filed: Nov. 19, 1971

[21] Appl. No.: 200,543

[52] U.S. Cl. .................................. 328/134, 307/233
[51] Int. Cl. .............................................. H03b 3/04
[58] Field of Search ....................... 324/79; 307/233; 328/133, 134

[56] References Cited

UNITED STATES PATENTS

| | | | |
|---|---|---|---|
| 3,519,929 | 7/1970 | Ault | 328/134 |
| 3,308,387 | 3/1967 | Hackett | 324/79 |
| 2,561,182 | 7/1951 | Crane | 324/89 |
| 3,021,481 | 2/1962 | Kalmus | 328/133 |
| 3,441,342 | 4/1969 | Ball | 328/134 |
| 3,517,322 | 6/1970 | Law | 328/133 |
| 3,663,884 | 5/1972 | Pattantyus | 328/134 |
| 3,445,685 | 5/1969 | Roth | 307/233 |
| 3,657,659 | 4/1972 | Johnson | 307/232 |
| 3,553,605 | 1/1971 | Brock | 307/233 |

*Primary Examiner*—John W. Huckert
*Assistant Examiner*—Ro E. Hart
*Attorney*—Edward J. Norton

[57] ABSTRACT

Input frequency signal wave energy and the signal wave energy from a variable frequency oscillator are each squared and applied to separate monostable multivibrators. The output pulses from that multivibrator responsive to the input frequency signal wave energy are compared to the output pulses from that multivibrator coupled to the variable frequency oscillator. A resultant difference reflects the difference between the input frequency and the variable frequency oscillator frequency.

6 Claims, 3 Drawing Figures

FREQUENCY COMPARATOR SYSTEM

This invention relates to a frequency comparator system and more particularly to one in which the frequency of input signal wave energy is compared to a local oscillator frequency for deriving a control signal as in an automatic frequency control system.

In unmanned, radio frequency relay stations receiving a very wide range of frequency input, the fine tuning systems are extremely complex. Simple AFC (automatic frequency control) systems are too frequency dependent. The output of a ratio detector, for example, which can be used for shifting the frequency of a beating oscillator does not provide a continuous d.c. output for a given condition but rather provides an S curve output dependent on center frequency of the detector.

In phase locked loop systems a multiple sawtooth wave is generated with locking points at the harmonic multiples of the fundamental frequency. It is therefore desirable to provide a system which is relatively independent of frequency for providing a continuous output of one sign whenever the incoming frequency is above the variable oscillator frequency and a continuous output of an opposite sign whenever the incoming frequency is below the variable oscillator frequency.

This and other features are obtained in the present invention by a frequency comparator system wherein the input frequency signal wave energy and the wave energy from a variable frequency oscillator are each squared and applied to separate pulse generators each generating the same fixed number of fixed duration pulses in response to each wave. The pulses from the pulse generators are coupled to a summing circuit, the output of the summing circuit reflecting the difference between the input frequency and the locally generated oscillator frequency.

A further description follows in conjunction with the following drawing wherein.

Figures 1, 2, 3:
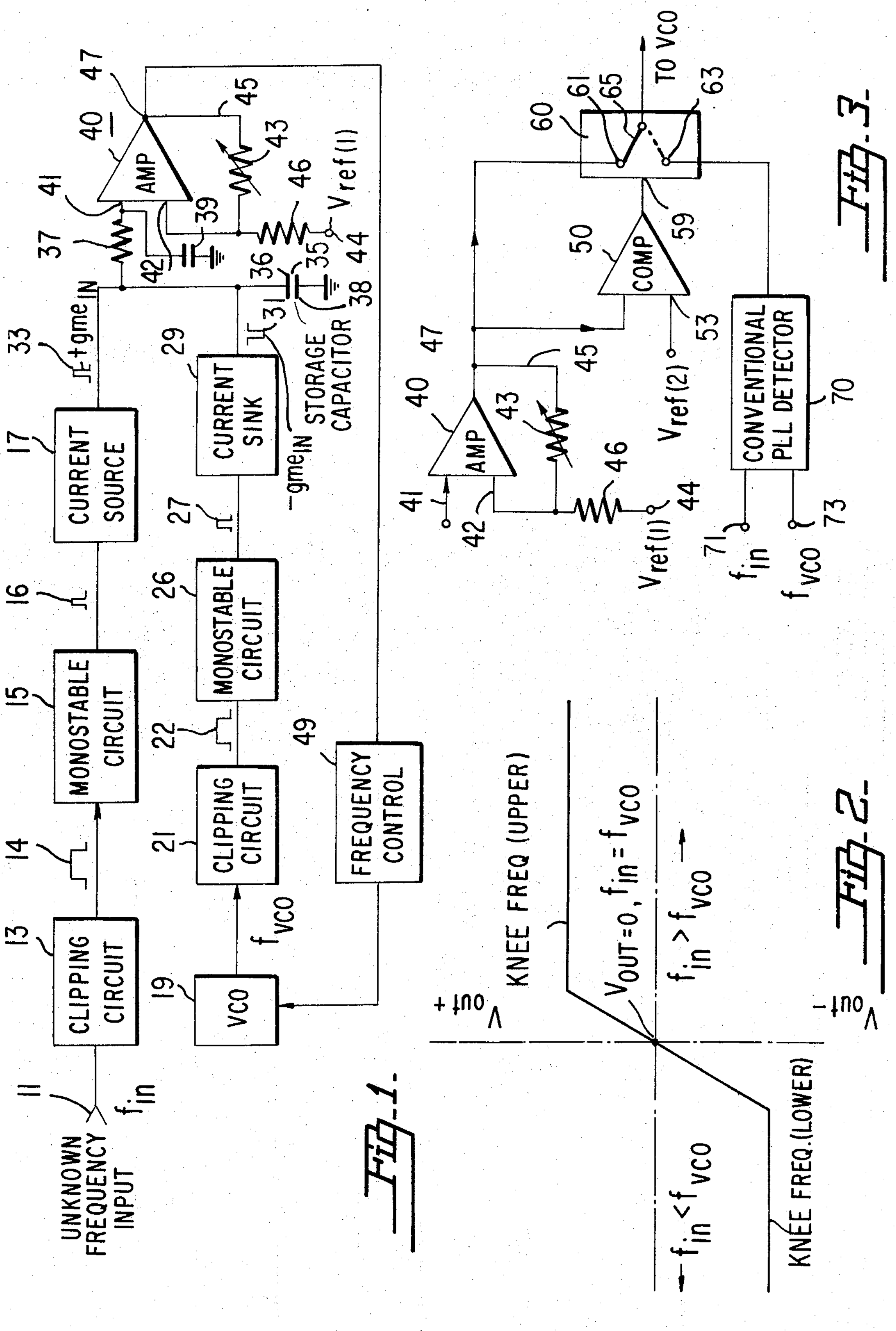
FIG. 1 is a diagram of a frequency comparator of the present invention shown partly in circuit form and partly in block form.
FIG. 2 illustrates the transfer function of the system shown in FIG. 1.
FIG. 3 is a schematic diagram illustrating how the comparator system of FIG. 1 may be used with a phased locked loop (PLL) system in a phase locking system.

Referring to FIG. 1, the input signal at frequency $f_{in}$ is coupled from an antenna 11 or other input means to a clipping circuit 13. At the clipping circuit 13 the incoming frequency wave is squared to produce a first plurality of square waves 14. Square waves 14 are applied to a monostable multivibrator 15. In response to each of the pulses 14, the monostable multivibrator 15 produces, for example, one short, fixed duration pulse 16. If desired more than one fixed duration pulse may be provided out of multivibrator 15 per wave. The short pulses 16 are then applied to a current source 17. The current source 17 is coupled to one terminal 36 of a storage capacitor 35. The opposite terminal 38 of capacitor 35 is coupled to ground. The current source 17 in response to each short duration pulse 16 provides a positive going current output pulse 33 equal to $+gme_{IN}$, where gm equals the transconductance and $e_{IN}$ equals the input voltage. This current source 17 may be, for example, a gated operational transconductance amplifier (OTA) such as the CA3080 sold by RCA, Solid State Division in Somerville, N.J. The short duration pulses 16 are fed to the non-inverting input terminal of this amplifier.

A local oscillator 19 generates wave energy of a frequency within the expected range of the input frequency ($f_{in}$). This local oscillator 19 would be, in the case of an automatic frequency controlled system, a voltage controlled oscillator (VCO). A voltage controlled oscillator refers to that type of oscillator in which the frequency of oscillation can be controlled by changing the applied voltage to the oscillator.

The output of the VCO oscillator 19 is applied to a clipping circuit 21, wherein the waves are clipped to provide at the output square waves 22. The square waves 22 are then coupled to a monostable multivibrator 26, which multivibrator provides in response to each square wave 22 the same given number (one in the example) of short, fixed duration pulses 27 per wave as are produced by monostable multivibrator 15. The duration of the short duration pulses 16 and 27 is therefore independent of the incoming frequency.

The short duration pulses 27 are then fed to a current sink 29. The current sink 29 is coupled to the one terminal 36 of the storage capacitor 35. The current sink 29 in response to short duration pulse 27 provides a negative going or current sinking pulse 31 to discharge capacitor 35. This pulse 31 equals $-gme_{IN}$. This current sink 29 may be provided, for example, by a second gated operational transconductance amplifier (OTA), such as the CA3080. The input pulses 27 in this case would be coupled to the inverting terminal of this OTA device.

Capacitor 35 is charged by the current pulse 33 and discharged by the current pulse 31. The stepped waveform appearing at the capacitor 35 is then smoothed by a filter circuit comprising resistor 37 and capacitor 39. If, over a selected time period (determined in part by the filter circuit) the output from the current source 17 provides more current than source 29 sinks, the output from the capacitor 35 will be positive and a positive potential will appear at terminal 41 of comparator amplifier 40. If the current sink 29 effectively removes more charge at the capacitor 35 than the current source 17 provides, then, the charge on the capacitor 35 will be negative.

The amplifier 40 is a d.c. amplifier biased by a d.c. reference voltage ($V_{ref(1)}$) coupled at terminal 44 and applied through resistor 46 to input terminal 42. The amplifier 40 has a gain adjustment loop 45 coupled between the output terminal 47 and input terminal 42. By adjusting the resistance 43 in the closed loop 45, the amplifier gain is adjusted and the efective knee frequencies of the system are adjusted.

At a balanced condition or when the output frequency from oscillator 19 equals the input frequency, the charge on capacitor 35 is substantially zero and the output from the amplifier 40 will be equal to the reference voltage ($V_{ref(1)}$) multiplied by the gain of the comparator amplifier 40. If the output frequency from oscillator 19 is less than the input frequency, the net charge on the capacitor 35 will be positive, and the output from amplifier 40 is coupled to a frequency controlling circuit 49 for oscillator 19, raising the frequency of oscillator 19. If the output frequency from oscillator 19 is more than the input frequency, the charge on capacitor 35 is negative. The output from amplifier 40 becomes more negative or below that of reference voltage ($V_{ref1)}$) multiplied by the gain of comparator amplifier 40. This more negative voltage coupled to the frequency controlling circuit 49 of oscillator 19 causes a change in the voltage applied to oscillator 19 and the frequency of oscillator 19 is lowered.

Referring to FIG. 2, there is illustrated the transfer characteristic of the system described above in FIG. 1. As indicated at the right of FIG. 2, the system provides a continuous positive output whenever the incoming frequency ($f_{in}$) is greater than the VCO frequency. As indicated at the left of FIG. 2, the system provides a continuous negative output whenever the incoming frequency $f_{in}$ is less than the VCO frequency. The linear ramp passes through zero when the incoming frequency ($f_{in}$) equals the VCO oscillator frequency ($f_{VCO}$). As discussed above, the upper and lower frequency limit (knee frequencies) can be adjustable.

Referring to FIG. 3, there is illustrated how the above system can be used for a phase locking system. The output from comparator amplifier 40 is coupled to terminal 51 of a comparator 50. A second reference voltage ($V_{ref2)}$) is provided at terminal 53. The voltage ($V_{ref2)}$) at terminal 53 is selected so that the comparator 50 detects the balanced condition at the output of amplifier 40 and provides an output to terminal 59 of switch 60. The output from comparator amplifier 40 is coupled to terminal 61 of switch 60. The input frequency sIgnal is coupled to terminal 71 of a conventional phased locked loop detector 70. The VCO frequency signal from oscillator 19 is coupled to terminal 73 of phased locked loop detector 70. The output of the phase locked loop detector 70 iS coupled to terminal 63 of switch 60. The arm 65 of switch 60 is normally coupled to terminal 61 and therefore control to the VCO frequency oscillator is through the previously described frequency locking system. Once frequency lock is obtained as detected at comparator 50, the arm 65 of electronic switch 60 is switched in response to output at terminal 59 so that only the output from the phase locked loop detector 70 is coupled through switch 60 to provide the VCO oscillator input. In this way locking to the harmonic frequency is completely prevented since the phase lock detector has no control over the VCO oscillator until frequency lock is obtained.

At very high frequencies of operation it may be difficult to use monostable multivibrator circuits. High speed frequency dividers can be used prior to these monostable circuits. The same divide ratio would have to be used for both the $f_{in}$ signal and the VCO signal. The phased locked loop detector, if used, would still operate directly (without frequency division) from the $f_{in}$ antenna input and the VCO output.

What is claimed is:

1. A circuit for comparing input frequency waves to locally generated frequency waves comprising:

first means responsive to each wave of said input frequency waves for generating first pulses of a given number, of a first polarity, of a given magnitude and of fixed duration, second means responsive to each wave of said locally generated frequency waves for generating second pulses of said given number of a polarity opposite to said first polarity, of a given magnitude and of said fixed duration, and means coupled to said first and second means for algebraically summing the magnitudes of said first and second pulses over a time period to provide an output signal proportional to the difference between said input frequency and said locally generated frequency.

2. A circuit for comparing input frequency waves to locally generated waveS comprising:

means responsive to said input frequency waves for squaring said waves, a first monostable multivibrator responsive to each wave of said squared input frequency waves for providing a given number of first pulses of fixed duration and of a given magnitude, means responsive to said locally generated frequency waves for squaring said waves, a second monostable multivibrator responsive to each wave of said squared locally generated frequency waves for providing second pulses of said given number, of said fixed duration and of a given magnitude, means for inverting the polarity of said second pulses relative to said first pulses, and means coupled to said first and second monostable multivibrators for algebraically summing the magnitudes of said first and second pulses over a time period to provide an output signal proportional to the difference between said input frequency and said locally generated frequency.

3. The combination as claimed in claim 2 wherein said summing means includes a capacitor, a current source coupled between said first monostable multivibrator and said capacitor for charging said capacitor in a first sense and a current sink coupled between said second monostable multivibrator and said capacitor for discharging said capacitor and charging said capacitor in a second sense.

4. The combination as claimed in claim 3 wherein said summing circuit further includes a filter coupled to said capacitor for smoothing the output from said capacitor.

5. The combination as claimed in claim 4 wherein said summing means further includes a d.c. amplifier coupled to the output of said filter.

6. In combination:

a first comparator circuit for comparing input frequency waves to locally generated frequency waves, said first comparator comprising:

means responsive to said input frequency waves for squaring said waves, a first monostable multivibrator responsive to each wave of said squared input frequency waves for providing first pulses of a given number and of a fixed duration, means responsive to said locally generated frequency waves for squaring said waves, a second monostable multivibrator responsive to each wave of said squared locally generated frequency waves for providing second pulses of said given number and of said fixed duration, means coupled to said first and second monostable multivibrators for summing said first and second pulses to provide an output that reflects the difference between said input frequency and said locally generated frequency, switch means having a pair of input terminals and an output terminal, said first input terminal coupled to the output of said summing means of said first comparator, said switch means normally coupling signals applied to said first input terminal to said switch means output terminal, a phase locked loop detector coupled at one input end to said locally generated frequency waves and said input frequency waves for providing detected phase differences, said phase locked loop detector coupled at the output end to said second input terminal of said switch means, a second comparator coupled between the output of said first comparator and said switch means for causing said switch means to change state and couple only signals at said second input terminal of said switch means when the output from said first comparator indicates no difference between said input frequency and said locally generated frequency.

* * * * *

Disclaimer 3,783,394.—*Leslie Ronald Avery*, Byflett, England. FREQUENCY COMPARATOR SYSTEM. Patent dated Jan. 1, 1974. Disclaimer filed July 17, 1974, by the assignee, *RCA Corporation*.

Hereby enters this disclaimer to claims 1–5 of said patent.

[*Official Gazette July 8, 1975.*]